(12) United States Patent
Ping et al.

(10) Patent No.: US 8,415,663 B2
(45) Date of Patent: Apr. 9, 2013

(54) SYSTEM AND METHOD FOR TEST STRUCTURE ON A WAFER

(75) Inventors: Wang Jian Ping, Shanghai (CN); Chin Chang Liao, Shanghai (CN); Waisum Wong, Shanghai (CN)

(73) Assignee: Semiconductor Manufacturing International (Shanghai), Shanghai (CN)

( * ) Notice: Subject to any disclaimer, the term of this patent is extended or adjusted under 35 U.S.C. 154(b) by 445 days.

(21) Appl. No.: 12/616,749

(22) Filed: Nov. 11, 2009

(65) Prior Publication Data

US 2010/0164508 A1    Jul. 1, 2010

(30) Foreign Application Priority Data

Dec. 31, 2008 (CN) .......................... 2008 1 0205397

(51) Int. Cl.
    *H01L 23/48* (2006.01)
(52) U.S. Cl.
    USPC ............. 257/48; 257/431; 257/620; 257/526; 257/E23.011; 257/E21.59; 324/537; 324/765; 438/667; 438/18; 438/132
(58) Field of Classification Search ............ 257/48, 257/431, E23.001, E23.011, E21.59, 620, 257/536, 734; 324/537, 750, 3, 765; 438/667, 438/18, 132

See application file for complete search history.

(56) References Cited

U.S. PATENT DOCUMENTS

| 2007/0168818 A1* | 7/2007 | Kang et al. .................... 714/745 |
| 2009/0058455 A1* | 3/2009 | Ko et al. ...................... 324/765 |

* cited by examiner

*Primary Examiner* — Cathy N Lam
(74) *Attorney, Agent, or Firm* — Kilpatrick Townsend & Stockton LLP

(57) ABSTRACT

System and method for test structure on a wafer. According to an embodiment, the present invention provides a test structure for testing a chip. For example, the test structure and the chip are manufactured on a same substrate material and the testing being conducted is in a temperature-controlled environment. The test structure includes a top structure positioned above the chip. For example, the top structure can be characterized by a first surface area. The top structure includes a first metal material occupying less than 60% of the surface area. The test structure also includes a bottom structure positioned below the chip. For example, the bottom structure can be characterized by a second surface area. The second surface area is substantially equal to the first surface area. The bottom structure includes a first silicon material. The first silicon material occupies substantially all of the second surface area.

18 Claims, 5 Drawing Sheets

SYSTEM AND METHOD FOR TEST STRUCTURE ON A WAFER

CROSS-REFERENCES TO RELATED APPLICATIONS

This application claims priority to Chinese Patent Application No. 200810205397.2, filed Dec. 31, 2008, commonly assigned and hereby incorporated by reference for all purposes.

BACKGROUND OF THE INVENTION

The present invention is directed to integrated circuits and their processing for the manufacture of semiconductor devices. More particularly, the invention provides a method and device for testing semiconductors. Merely by way of example, the invention has been applied to testing semiconductor degradation under certain stress. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. One of the limitations in semiconductor manufacturing has been ensuring the reliability of semiconductors.

In the past, different types of testing methods and structures have been developed. Sometimes, package level reliability test, which requires dicing a wafer into pieces for the purpose of testing, is used. The process of dicing a wafer and testing pieces of semiconductor is often costly and slow. To speed things up, wafer level reliability test is sometimes used. During a wafer level reliability test, one or more test keys are often used. A test key, for example, is a circuit that is manufactured at the same time as the wafer under the same condition so that the reliability and performance of the wafer can be determined by the reliability and performance of test keys. Generally, test keys are placed at spare areas on a wafer or die. Unfortunately, abovementioned techniques for semiconductor testing are often inadequate. These and other limitations of the conventional techniques have been overcome, at least in part, by the invention that has been fully described below.

Therefore, it is desirable to have an improved method and system for a test structure on a wafer.

BRIEF SUMMARY OF THE INVENTION

The present invention is directed to integrated circuits and their processing for the manufacture of semiconductor devices. More particularly, the invention provides a method and device for testing semiconductors. Merely by way of example, the invention has been applied to testing semiconductor degradation under certain stress. But it would be recognized that the invention has a much broader range of applicability.

According to an embodiment, the present invention provides a test structure for testing a chip. For example, the test structure and the chip are manufactured on a same substrate material and the testing being conducted is in a temperature-controlled environment. The test structure includes a top structure positioned above the chip. For example, the top structure can be characterized by a first surface area. The top structure includes a first metal material occupying less than 60% of the surface area. The test structure also includes a bottom structure positioned below the chip. For example, the bottom structure can be characterized by a second surface area. The second surface area is substantially equal to the first surface area. The bottom structure includes a first silicon material, such as polysilicon material, etc. The first silicon material occupies substantially all of the second surface area. The test structure additionally includes a first side structure positioned between the top structure and the bottom structure and located next to a first side of the chip. The first side structure can characterized by a first height. And the first side structure including a second metal material. Additionally, the test structure includes a second side structure positioned between the top structure and the bottom structure and located next to a second side of the chip. The second side structure can characterized by a second height. The second side structure includes a third metal material.

According to another embodiment, the present invention provides a method for testing a chip using a test structure in a temperature-controlled environment. For example, the chip and the test structure are on a same substrate material. The method includes a step for providing a top structure positioned above the chip. The top structure can be characterized by a first surface area. The top structure includes a first metal material occupying less than 60% of the surface area. The method also includes a step for providing a bottom structure positioned below the chip. The bottom structure can be characterized by a second surface area. The second surface area is substantially equal to the first surface area. The bottom structure includes a first silicon material. The first silicon material occupies substantially all of the second surface area. The method additionally a step for providing a first side structure positioned between the top structure and the bottom structure and located next to a first side of the chip. The first side structure can be characterized by a first height. The first side structure includes a second metal material. The method also include a step for providing a second side structure positioned between the top structure and the bottom structure and located next to a second side of the chip. The second side structure can be characterized by a second height. The second side structure includes a third metal material. Additionally, the method includes a step for subjecting the chip and the test structure to the temperature control environment (e.g., a heat chamber). Moreover, the method includes a step for obtaining a plurality of data (e.g., resistance, stress level, etc.) that is associated with the chip.

According to yet another embodiment, the present invention provides a test structure for testing a chip. For example, the test structure and the chip are manufactured on a same substrate material and the testing being conducted is in a temperature-controlled environment. The test structure includes a top structure positioned above the chip. The top structure includes a first metal material. The first metal material includes a first electrical terminal and a second electrical terminal. The test structure also includes a bottom structure positioned below the chip. The bottom structure includes a first silicon material. The test structure additionally includes a first side structure positioned between the top structure and the bottom structure and located next to a first side of the chip. The first side structure can be characterized by a first height. The first side structure includes a second metal material. The test structure additionally includes a second side structure positioned between the top structure and the bottom structure and located next to a second side of the chip. The second side structure can be characterized by a second height. The second side structure includes a third metal material.

It is to be appreciated that the present invention provides various advantages over conventional techniques. According to certain embodiments, the present invention allows substantially uniform heating of test keys for many different types of testing conditions. The temperature uniformity as provided by the present invention allows more accurate testing of IC. In addition, the present invention simplifies testing procedure. For example, conventional techniques of testing often requires up to five pins for manual tests. According to certain embodiments, only two pins (used to provide current) are needed. For example, one end of the top heater, bottom heater, and sidewall are connected together and linked to one pad. In addition to convenience, the simplified testing provided by the present invention allows wafer-level electro-migration tests free from isothermal electro-migration model which must use high electro-current joule heating. Depending upon embodiments, there are other advantages as well.

The present invention is directed to integrated circuits and their processing for the manufacture of semiconductor devices. More particularly, the invention provides a method and device for testing semiconductors. Merely by way of example, the invention has been applied to testing semiconductor degradation under certain stress. But it would be recognized that the invention has a much broader range of applicability.

DETAILED DESCRIPTION OF THE INVENTION

The present invention is directed to integrated circuits and their processing for the manufacture of semiconductor devices. More particularly, the invention provides a method and device for testing semiconductors. Merely by way of example, the invention has been applied to testing semiconductor degradation under certain stress. For example, high temperature is applied to test structures to create stress condition in order to determine semiconductor reliability. But it would be recognized that the invention has a much broader range of applicability.

Reliability tests often need high temperature environment to accelerate device or circuit performance degradation under certain stress. Most reliability test use package level tests, which need to dice the wafer into pieces. Typically, package level tests allows high temperature to be used during high temperature reliability tests. In addition, multiple tests can be performed using package level tests. However, the dicing of wafer is often expensive and slow. In addition, moisture absorption is frequently a problem for package level tests.

Another method of testing is wafer level reliability testing. Wafer level reliability tests have an advantage of low cost and quick feedback. Unfortunately, conventional wafer level reliability tests have their limitation. For example, there are often two common problems associated with wafer level reliability tests. One problem is that wafer level testers and probe cards often cannot support a temperature that is high enough for the purpose of testing. A second problem is that wafer level reliability tests often fails to provide a flexible and selective testing. For example, for high temperature testing, conventional wafer level reliability test often requires heating all dies on a wafer.

Figure 1:
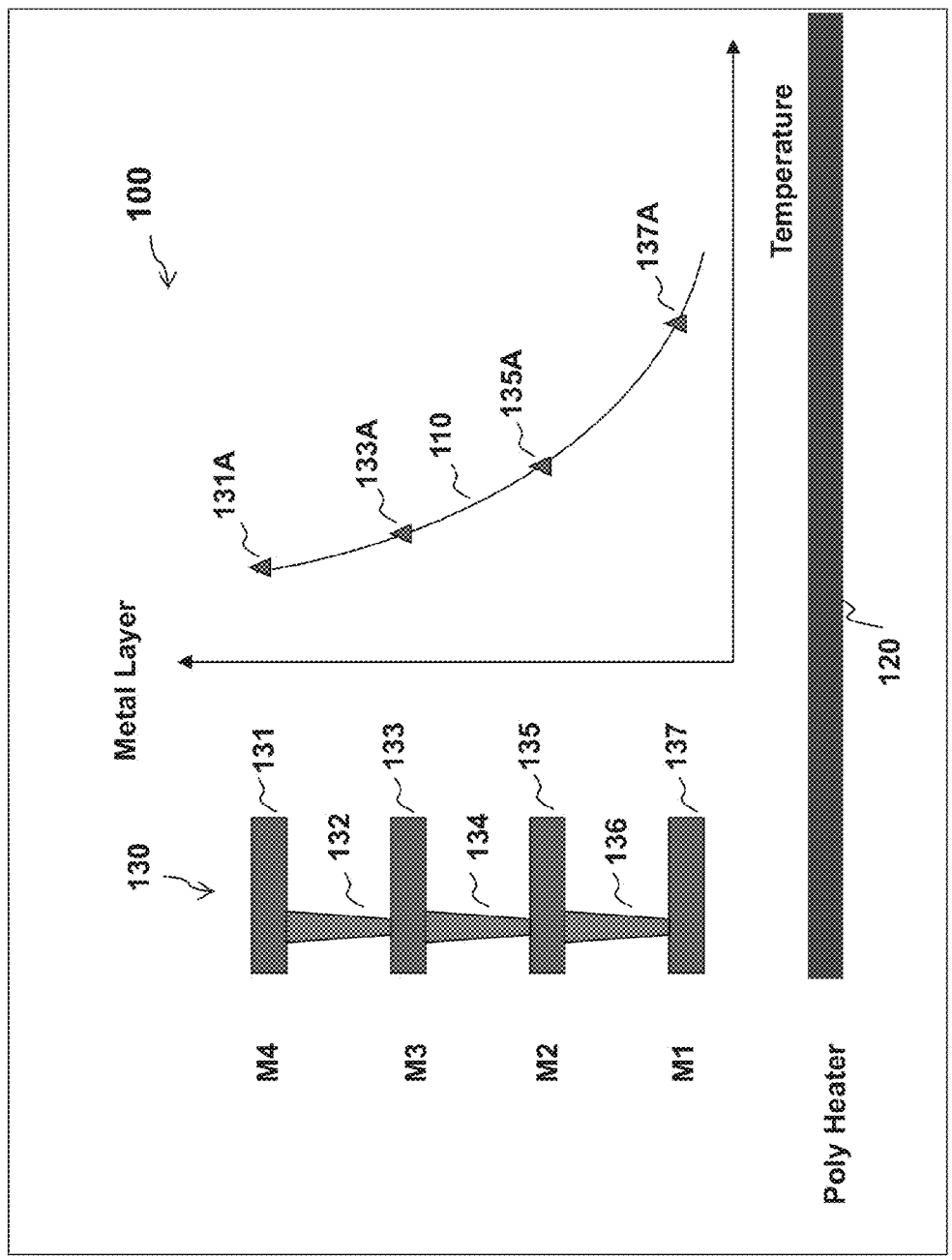
FIG. 1 is a simplified diagram of a graph illustrating the temperature distribution of a test structure heated by a poly heater.

To be able to heat only selected dies on a wafer for the purpose of testing, a poly heater can be used. For example, poly heaters are used to heat one or more test keys on a wafer. Poly heater testing has several advantages. For example, poly heater testing allows a local heater to be used. In addition, independent heating currents can be used. Better temperature control can be achieved. Unfortunately, poly heater testing has limitations. Since the poly heating technique often involves heating at one side of a test structure, uneven temperature distribution at the test structure is often a problem. FIG. 1 is a simplified diagram of a graph illustrating the temperature distribution of a test structure heated by a poly heater.

FIG. 1 includes a test structure 130 and a graph 100 illustrating temperature at different layers of test structure 130 due to the heating of a poly heater 120. The poly heater 120 provides heat to the test structure 130. The test structure 130 includes four metal layers 131, 133, 135, and 137. The metal layer 137 is disposed close to the poly heater 120. The metal layer 131 is disposed relatively far away from the poly heater 120. As a result, as shown on a curve 110, the temperature (as indicated by a mark 137A on the curve 110) of the metal layer 137 is relatively high due to its proximity to the poly heater 120. The metal layer 131, in contrast, has a relatively low temperature (as indicated by a mark 131A on the curve 110) for being disposed at a distance from the poly heater 120. Similarly, the temperature of metal layers 133 and 135 are related to their distance from the poly heater and are indicated as 133A and 135A on graph 110.

The uneven temperature distribution as illustrated in FIG. 1 does not adequately provide a reliable heating. Among other things, the uneven temperature distribution often causes inaccuracy in the testing process. Such inaccuracy limits the application of the poly heater testing method. For example, test keys such as stack via and via chain, where many metal layers are heated, are usually not used in conjunction with poly heaters.

It is to be appreciated that the present invention provides a method and system for testing reliability of IC on a semiconductor wafers. According to certain embodiments, the present invention allows even heating of test structures on a wafer. Merely by of an example, certain embodiments of the present invention allow wafer level reliability testing that is related to, among other things, via electron migration and via stress migration.

Figure 2:
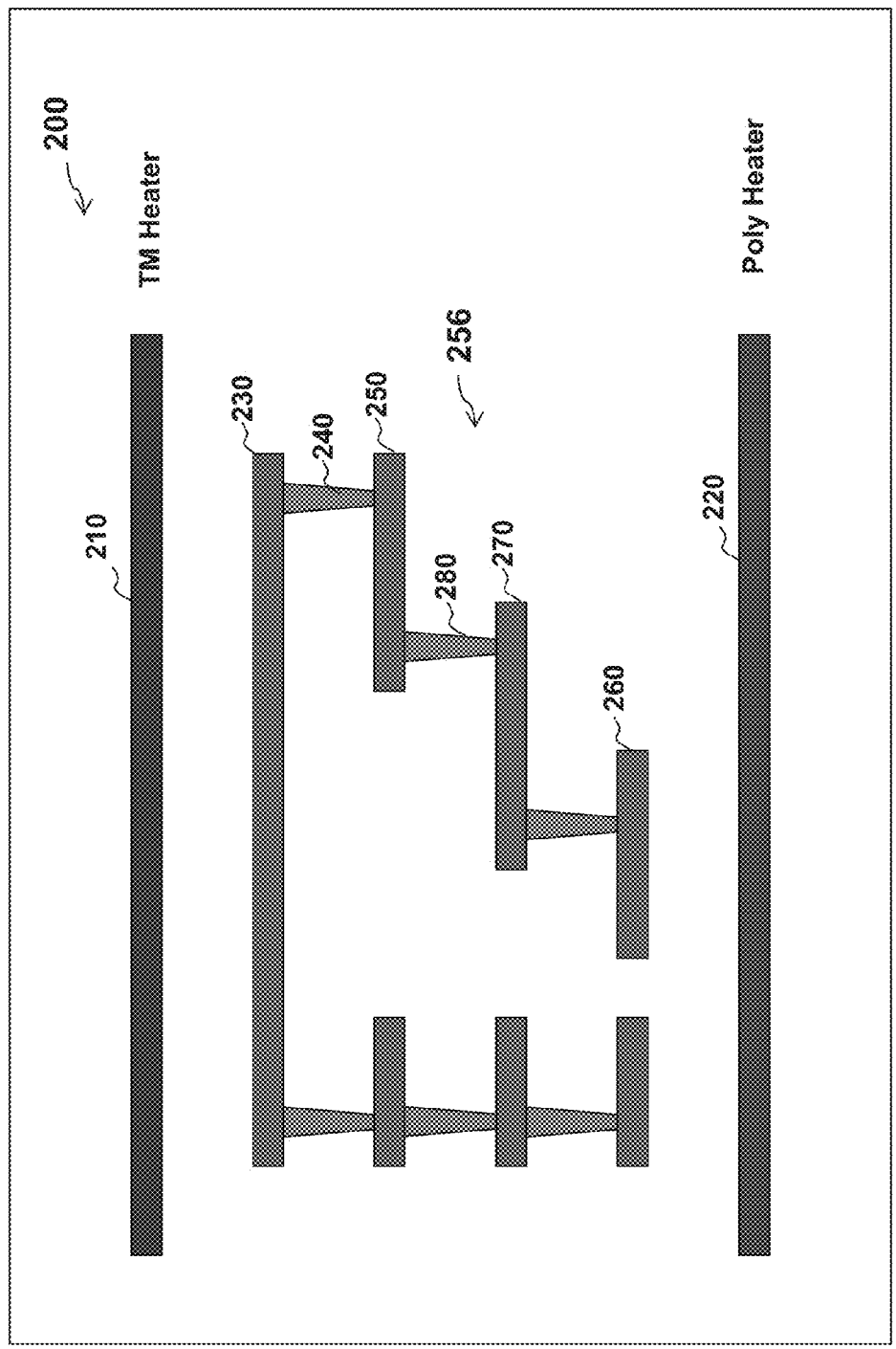
FIG. 2 is a simplified diagram illustrating a side view of a test structure according to an embodiment of the present invention.

FIG. 2 is a simplified diagram illustrating a side view of a test structure according to an embodiment of the present invention. This diagram is merely an example, which should not unduly limit the scope of the claims. One of ordinary skill in the art would recognize many variations, alternatives, and modifications. As illustrated in FIG. 2, a test structure 200 includes a top heater 210, a bottom heater 220, and a sidewall 256. For example, the test structure 200 is a part of a wafer. According to an embodiment, the top heater 210 includes a metal resistor. For example, the top heater 210 includes a copper-based resistor. According to an embodiment, the bottom heater 220 is a poly resistor. For example, the bottom heater 220 includes a rectangular poly resistor that functions as a heater. The sidewall 256 includes a plurality of metal layers and vias. For example, the sidewall 256 includes metal layers 230, 250, and 270 that are interconnected through vias 240 and 280. It is appreciated that according to some embodiments, the sidewall 256 shares a structure that is substantially the same as the wafer so that the temperature characteristics associated with the test structure is substantially similar to the temperature characteristics of the wafer.

Figure 3:
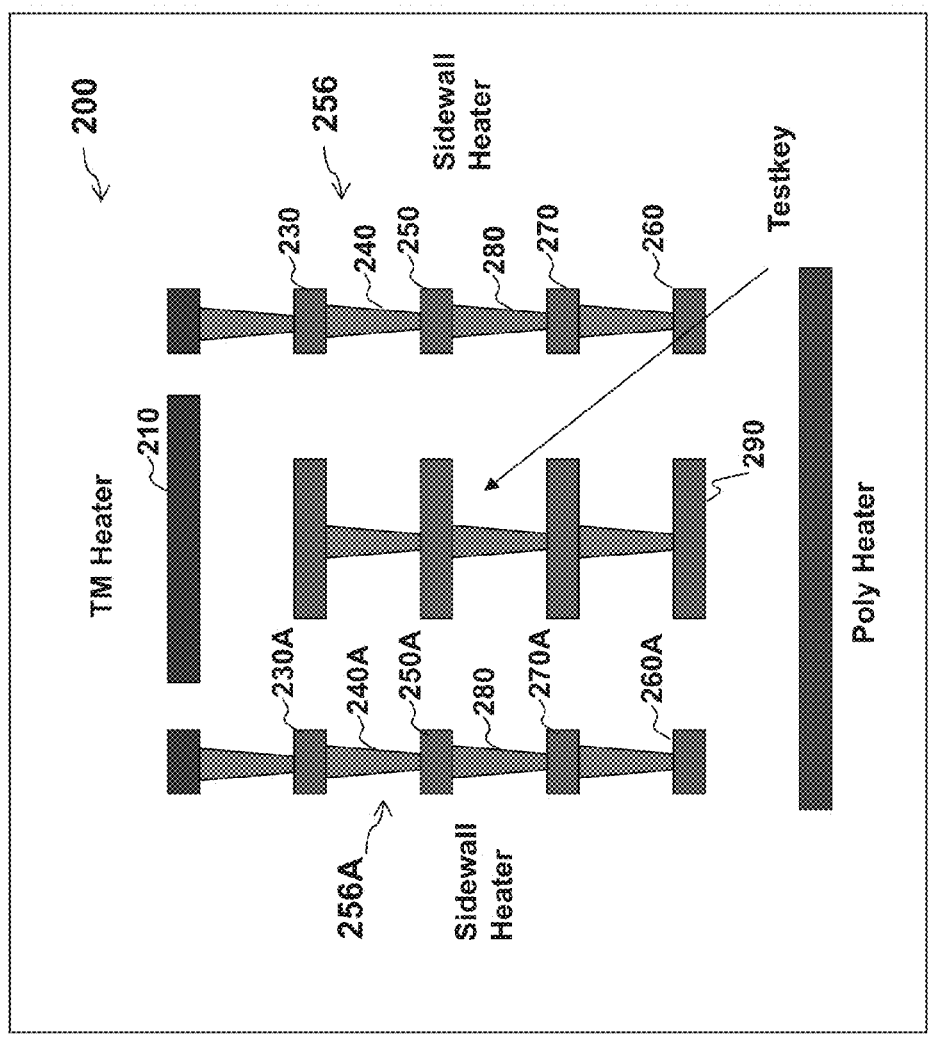
FIG. 3 is a diagram illustrating an alternative side view of a test structure according to an embodiment of the present invention.

FIG. 3 is a diagram illustrating an alternative side view of a test structure according to an embodiment of the present invention. This diagram is merely an example, which should not unduly limit the scope of the claims. One of ordinary skill in the art would recognize many variations, alternatives, and modifications. As illustrated according to FIG. 3, a test structure 200 includes a top heater 210, a bottom heater 220, and sidewalls 256 and 256A. The test structure 200 contains a test key 290. For example, the test key 290 shares essentially the same characteristics as the wafer so that its characteristics under high temperature resembles the characteristics of the wafer under similar circumstances. Depending upon applications, the test key 290 can be a via stack or a via chain. As illustrated according to FIG. 3, the test key 290 is surrounded by the test structure 200 at its top, bottom, and sides. It is to be appreciated the test structure 200 allows even heating of the test key 290, as heating is possible at different regions that are close to the test key 290. For example, during high temperature testing, heat can be provided at the top heater 210, the bottom heater 200, and sides walls 256 and 256A. According to certain embodiments, the sidewalls 256 and 256A helps prevent moisture absorption at the test key 290. To ensure that the heating of the test key 290 is even during a high temperature test, the materials and patterns of different components of the test structure 200 is taken into consideration. According to an embodiment, to compensate the heating properties of heating materials, as the top heater 210 includes metal material and the bottom heater 220 includes poly material, the geometric shape of the top heater 210 reduces its surface area to account for the higher heat transitivity of the metal material.

Figure 4:
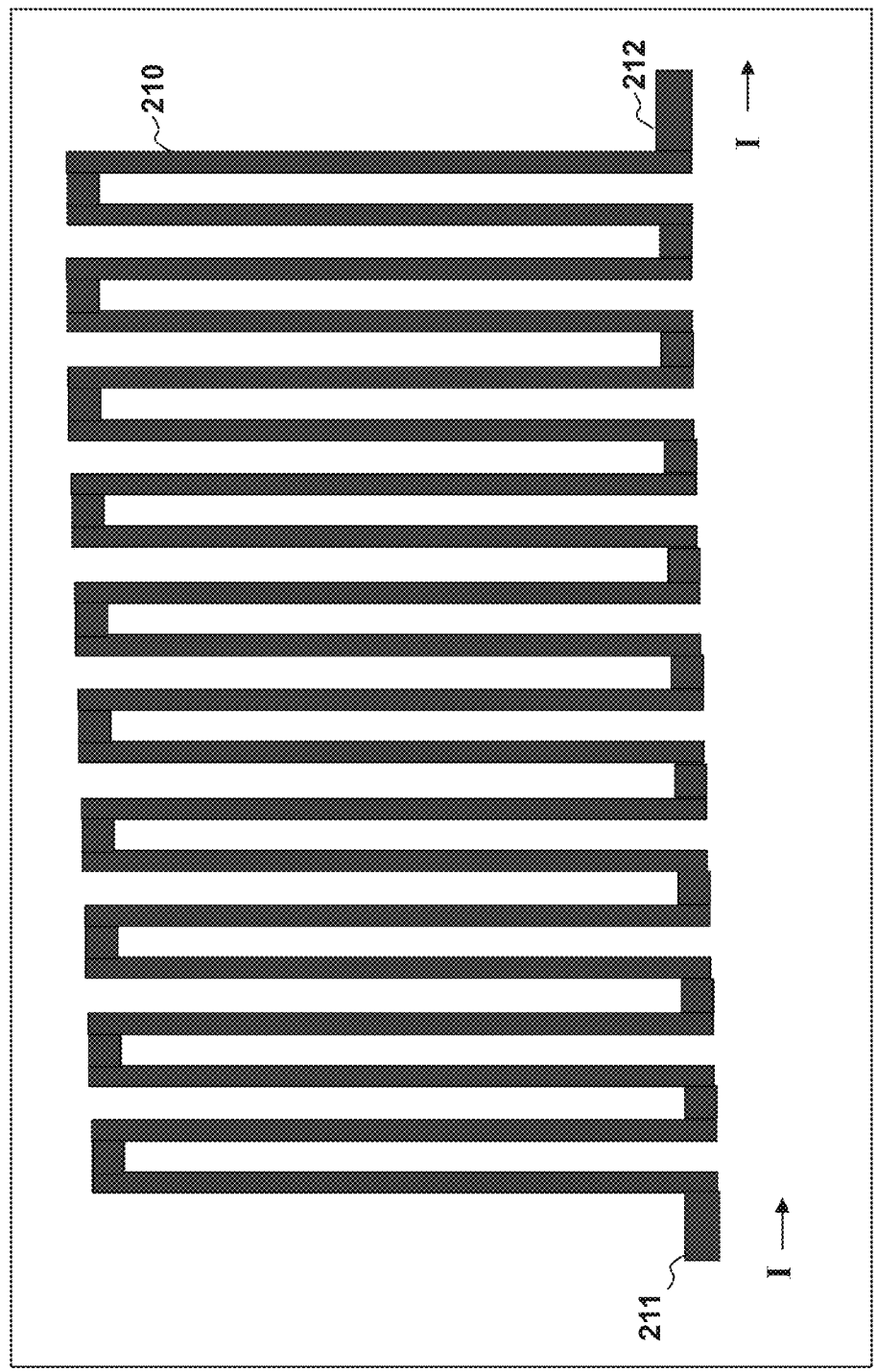
FIG. 4 is a simplified diagram illustrating a top view of a test structure according to an embodiment of the present invention.

FIG. 4 is a simplified diagram illustrating a top view of a test structure according to an embodiment of the present invention. This diagram is merely an example, which should not unduly limit the scope of the claims. One of ordinary skill in the art would recognize many variations, alternatives, and modifications. According to an embodiment, the top heater 210 from top view has a serpentine pattern. It is to be appreciated that the serpentine pattern reduces the surface area of top heater 210. For example, the reduced surface area accounts for the high heat transitivity of metal material at the top layer. According to an embodiment, the metal material occupies less than 60% of the surface area of the top heater. According to an embodiment, temperature coefficient of resistance (TCR) is used to perform resistance matching. In addition, the serpentine have other benefits. For example, the serpentine design increase the resistance of the top heater to match the resistance of the bottom heater. It is to be appreciated that the top heater can have other types of patterning as well. For example, the top heater 210 from the top view may have a zigzag pattern, a twirl pattern, etc. The top heater 210 also includes two ends 211 and 212. Depending upon applications, ends 211 and 212 allow current to be applied to the top heater for testing purposes.

Figure 5:
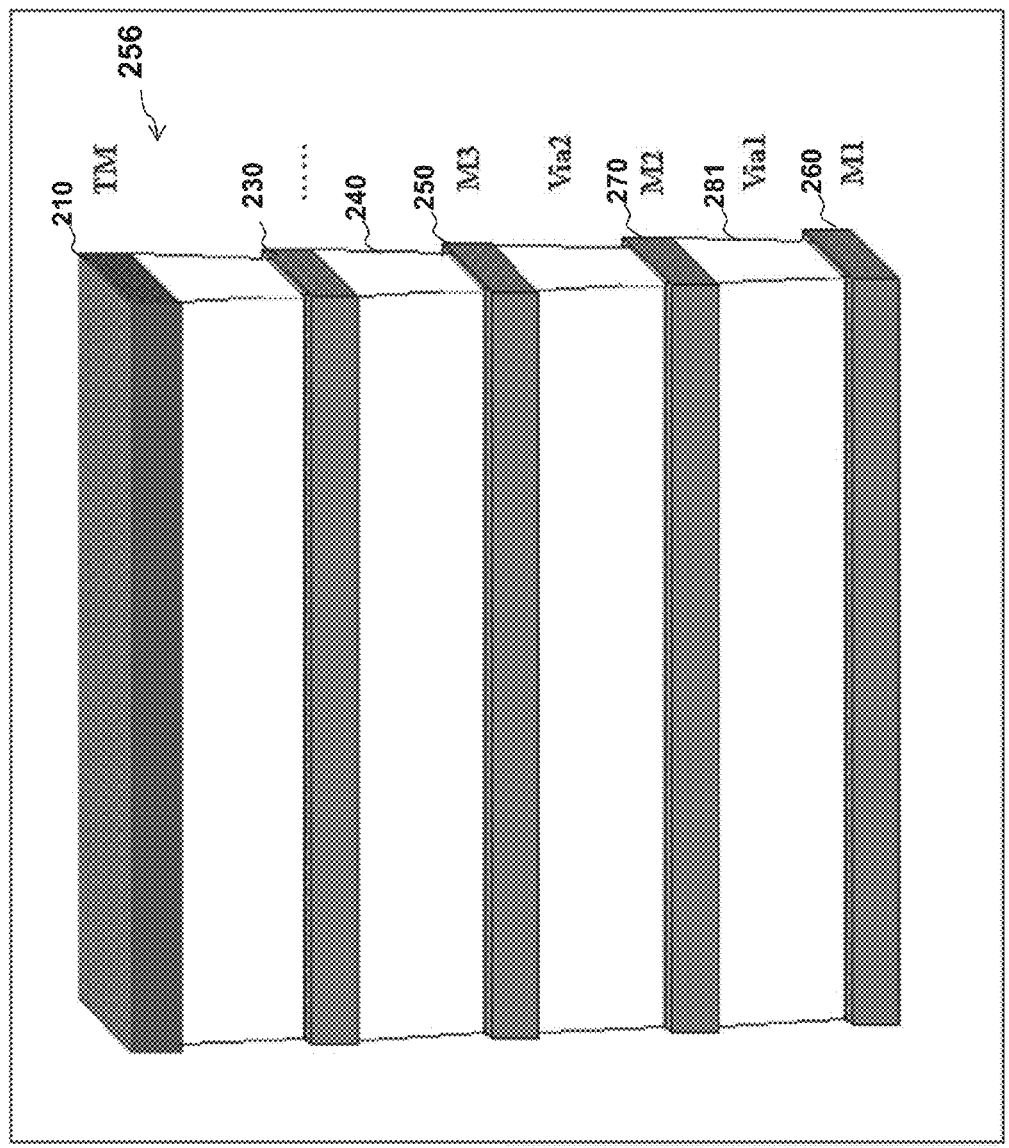
FIG. 5 is a simplified diagram illustrating a side view of a part of a test structure according to an embodiment of the present invention.

FIG. 5 is a simplified diagram illustrating a side view of a test structure according to an embodiment of the present invention. This diagram is merely an example, which should not unduly limit the scope of the claims. One of ordinary skill in the art would recognize many variations, alternatives, and modifications. According to an embodiment, the sidewall 256 as illustrated according to FIG. 5 includes layers of metal and via structures. The sidewall 256 includes metal layers 230, 240, 260, and 270. The sidewall 256 also includes via structures 240, 280, and 281. It is to be appreciated that there could be more or fewer metal layers and via structures. For example, the sidewall 256 may include twenty metal layers. According to an embodiment, the sidewall 256 protects the test key from moisture absorption.

Depending upon applications, test keys can be disposed in horizontal directions, and horizontal temperature uniformity may generally be an important factor. For example, test keys used to determine electro-migration stress are often placed in a horizontal direction. For certain applications, conventional techniques without the sidewall 256 are often adequate. However, when test keys are large, conventional techniques are often inadequate. The present invention enables temperature uniformity in both horizontal and vertical directions. Such uniformity enables tests that require uniform temperature. For example, for testing of large test keys, such as via chain structures that contain thousands of vias, the sidewall according to the present invention allows substantially uniform temperature distribution throughout the test structure and uniform heating of large test keys. According to certain embodiments, the sidewall 256 protects test keys from moisture absorption.

According to an embodiment, the present invention provides a test structure for testing a chip. For example, the test structure and the chip are manufactured on a same substrate material and the testing is conducted is in a temperature-controlled environment. The test structure includes a top structure positioned above the chip. For example, the top structure can be characterized by a first surface area. The top structure includes a first metal material occupying less than 60% of the surface area. The test structure also includes a bottom structure positioned below the chip. For example, the bottom structure can be characterized by a second surface area. The second surface area is substantially equal to the first surface area. The bottom structure includes a first silicon material, such as a polysilicon material, and the like. The first silicon material occupies substantially all of the second surface area. The test structure additionally includes a first side structure positioned between the top structure and the bottom structure and located next to a first side of the chip. The first side structure can be characterized by a first height. And the first side structure including a second metal material. Additionally, the test structure includes a second side structure positioned between the top structure and the bottom structure and located next to a second side of the chip. The second side structure can be characterized by a second height. The second side structure includes a third metal material.

According to another embodiment, the present invention provides a method for testing a chip using a test structure in a temperature-controlled environment. For example, the chip and the test structure are on a same substrate material. The method includes a step for providing a top structure positioned above the chip. The top structure can be characterized by a first surface area. The top structure includes a first metal material occupying less than 60% of the first surface area. The method also includes a step for providing a bottom structure positioned below the chip. The bottom structure can be characterized by a second surface area. The second surface area is substantially equal to the first surface area. The bottom structure includes a first silicon material. The first silicon material occupies substantially all of the second surface area. The method additionally includes a step for providing a first side structure positioned between the top structure and the bottom structure and located next to a first side of the chip. The first side structure can be characterized by a first height. The first side structure includes a second metal material. The method also include a step for providing a second side structure positioned between the top structure and the bottom structure and located next to a second side of the chip. The second side structure can be characterized by a second height. The second side structure includes a third metal material. Additionally, the method includes a step for subjecting the chip and the test structure to the temperature control environment (e.g., a heat chamber). Moreover, the method includes a step for obtaining a plurality of data (e.g., resistance, stress level, etc.) that is associated with the chip.

According to yet another embodiment, the present invention provides a test structure for testing a chip. For example, the test structure and the chip are manufactured on a same substrate material and the testing being conducted is in a temperature-controlled environment. The test structure includes a top structure positioned above the chip. The top structure includes a first metal material. The first metal material includes a first electrical terminal and a second electrical terminal. The test structure also includes a bottom structure positioned below the chip. The bottom structure includes a first silicon material. The test structure additionally includes a first side structure positioned between the top structure and the bottom structure and located next to a first side of the chip. The first side structure can be characterized by a first height. The first side structure includes a second metal material. The test structure additionally includes a second side structure positioned between the top structure and the bottom structure and located next to a second side of the chip. The second side structure can be characterized by a second height. The second side structure includes a third metal material.

It is to be appreciated that the present invention provides various advantages over conventional techniques. According to certain embodiments, the present invention allows substantially uniform heating of test keys for many different types of testing conditions. The temperature uniformity as provided by the present invention allows more accurate testing of IC. In addition, the present invention simplifies testing procedure. For example, conventional techniques of testing often requires up to five pins for manual tests. According to certain embodiments, only two pins (used to provide current) are needed. For example, one end of the top heater, bottom heater, and sidewall are connected together and linked to one pad. In addition to convenience, the simplified testing provided by the present invention allows wafer-level electro-migration tests free from isothermal electro-migration model which must use high electro-current joule heating. Depending upon embodiments, there are other advantages as well.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A test structure for testing an integrated circuit, wherein the test structure and the integrated circuit are manufactured on a same substrate material and the testing being conducted is in a temperature-controlled environment, the test structure comprising:
a top structure positioned above the integrated circuit, the top structure being characterized by a first surface area, the top structure including a first metal material occupying less than 60% of the first surface area;
a bottom structure positioned below the integrated circuit, the bottom structure being characterized by a second surface area, the bottom structure including a first silicon material, the first silicon material occupying substantially all of the second surface area;
a first side structure positioned between the top structure and the bottom structure and located next to a first side of the integrated circuit, the first side structure being characterized by a first height, the first side structure including a second metal material; and
a second side structure positioned between the top structure and the bottom structure and located next to a second side of the integrated circuit, the second side structure being characterized by a second height, the second side structure including a third metal material; wherein the top structure and the bottom structure are not physically and electrically connected to each other.

2. The test structure of claim 1 wherein the first metal material comprises a first terminal and a second terminal, the first terminal and the second terminal being configured to conduct a current through the first metal material to generate heat.

3. The test structure of claim 1 wherein the first height is substantially equal to the second height.

4. The test structure of claim 1 wherein the first side structure further comprises one or more vias.

5. The test structure of claim 1 wherein:
the first side is characterized by a first temperature characteristic; and
the second side is characterized by a second temperature characteristic;
the first temperature characteristic being substantially the same as the second temperature characteristic.

6. The test structure of claim 1 wherein:
the top structure is characterized by a third temperature characteristic; and
the bottom structure is characterized by a fourth temperature characteristic;
the third temperature characteristic being substantially the same as the fourth temperature characteristic.

7. The test structure of claim 1 wherein the first metal material comprises a geometric shape that is characterized by a temperature coefficient of resistance.

8. The test structure of claim 1 wherein the integrated circuit is characterized by a channel length of less than 130 nanometers.

9. The test structure of claim 1 wherein the first silicon material comprises a polysilicon material.

10. The test structure of claim 1 wherein the first metal material is characterized by a zigzag shape.

11. The test structure of claim 1 wherein the top structure further comprises a metal resistor.

12. The test structure of claim 1 wherein the top structure further comprises a copper-based resistor.

13. The test structure of claim 1 wherein the first metal material is characterized by a serpentine shape.

14. The test structure of claim 1 wherein each of the first and second side structures comprises one or more metal layers being interconnected by one or more vias.

15. The test structure of claim 1 wherein the top structure has a resistance that is substantially equal to a resistance of the bottom structure.

16. The test structure of claim 1 wherein the test structure has a temperature characteristic substantially equal to a temperature characteristic of the integrated circuit.

17. The test structure of claim 1 wherein the first surface area is substantially equal to the second surface area.

18. The test structure of claim 1 wherein the first and second side structures protect the integrated circuit from moisture absorption.

\* \* \* \* \*